United States Patent [19]

Stekelenburg

[11] Patent Number: 5,034,633
[45] Date of Patent: Jul. 23, 1991

[54] SENSOR CIRCUIT FOR CORRELATED DOUBLE SIGNAL SAMPLING

[75] Inventor: Michael A. W. Stekelenburg, Eindhoven, Netherlands

[73] Assignee: U. S. Philips Corporation, New York, N.Y.

[21] Appl. No.: 496,374

[22] Filed: Mar. 19, 1990

[30] Foreign Application Priority Data

Apr. 24, 1989 [NL] Netherlands ............... 8901019

[51] Int. Cl.$^5$ ............... H03K 17/16; H03K 19/003
[52] U.S. Cl. ............... 307/352; 307/443; 307/353; 307/260; 307/263; 307/269; 328/154; 358/445
[58] Field of Search ............... 307/443, 446, 352-353, 307/260, 263, 269; 328/154, 138; 358/445

[56] References Cited

U.S. PATENT DOCUMENTS

| | | | |
|---|---|---|---|
| 3,969,636 | 7/1976 | Baertsch et al. | 307/304 |
| 4,355,244 | 10/1982 | Benoit-Gonin et al. | 307/607 |
| 4,633,222 | 12/1986 | Dingwall | 307/353 |
| 4,896,212 | 1/1990 | Chantelou | 358/138 |
| 4,916,530 | 4/1990 | Neilson | 358/458 |

FOREIGN PATENT DOCUMENTS 0006715 1/1980 European Pat. Off. ......... 358/445

OTHER PUBLICATIONS

"Very High Speed CCD Clock-Pulse Driven Circuit", Research Disclosure, 4/89, 300, Kenneth Mason Publications.

Primary Examiner—Stanley D. Miller
Assistant Examiner—Margaret Rose Wambach
Attorney, Agent, or Firm—Edward W. Goodman

[57] ABSTRACT

In a sensor circuit, a sensor device (CTD) is followed by a sampling circuit (CDS) for performing a correlated double signal sampling, having capacitors (C1', C2') and two switches (S1, S2). For simply realizing a rigid coupling between a sensor output signal (PS) and sampling clock pulses (CL, SA), the circuit includes a clock pulse shaper (CST), two inputs (CT1, CT2) of which receive two out of at least three control clock pulse signals (C1, C2, C3) for controlling an output transport in an output shift register (SR).

3 Claims, 2 Drawing Sheets

SENSOR CIRCUIT FOR CORRELATED DOUBLE SIGNAL SAMPLING

BACKGROUND OF THE INVENTION

1. Field of the Invention

The invention relates to a sensor circuit for correlated double signal sampling, the sensor circuit comprising a sensor device having an output for supplying a sensor output signal, a sampling circuit coupled thereto for performing the sampling operation, and a clock pulse generator which is coupled to the sensor device and the sampling circuit for applying multi-phase control clock pulse signals thereto.

2. Description of the Related Art

A sensor circuit of this type is known from an Article in the journal "IEEE Journal of Solid-State Circuits" of Feb. 1974, pp. 1 to 12. The sensor device suitable for picture pick-up is described as a charge-coupled device which is a specific implementation of a charge transfer device for generating a picture signal as the sensor output signal. To obtain an improved picture quality upon display, the correlated double signal sampling operation is performed during pixel periods. The double signal sampling implies that during a pixel period, firstly the signal is clamped on a reference voltage level via a series capacitor, whereafter the actual signal sampling operation is performed with a storage of samples in a capacitor. In this way, as described, noise produced by a reset switch is removed, switching transients are eliminated and low-frequency noise is suppressed. A two-phase control is described of a parallel-in, series-out sensor output register for supplying the sensor output signal and of the sampling circuit operating with two series of sampling pulses.

In current sensor devices, the time difference between taking the two samples per pixel period is smaller or is of the order of 100 ns. This imposes strict requirements on the accuracy with which the sampling clock pulses are generated by the clock pulse generator. Consequently, the components of the clock pulse generator must not have a large spread in signal delay times and should remain stable in time. A complicated and expensive clock pulse generator must be used in the sensor circuit.

SUMMARY OF THE INVENTION

An object of the invention is inter alia to realize a sensor circuit comprising a simple and inexpensive clock pulse generator with which sufficiently accurate and stable clock pulses are generated for the sampling circuit. To this end, a sensor circuit according to the invention is characterized in that the clock pulse generator comprises at least three sensor clock pulse leads for an at least three-phase control clock pulse signal to control the supply of the sensor output signal, and a clock pulse shaper having two inputs and two outputs, the two inputs being coupled to two of the at least three sensor clock pulse leads and the two outputs being coupled to the sampling circuit.

By directly deriving the sampling clock pulses via the clock pulse shaper from output transport clock pulses on two sensor clock pulse leads to control the supply of the sensor output signal, a rigid coupling is realized between this output signal and the sampling clock pulses. Variations, due to some cause or other, in the output transport clock pulses are immediately followed by the sampling clock pulses so that the two types of clock pulses are rigidly coupled with respect to the sensor output signal.

BRIEF DESCRIPTION OF THE DRAWINGS

These and other aspects of the invention will be described and elucidated in greater detail by way of non-limiting example with reference to the accompanying drawings, in which.

DESCRIPTION OF THE PREFERRED EMBODIMENT

Figure 1:
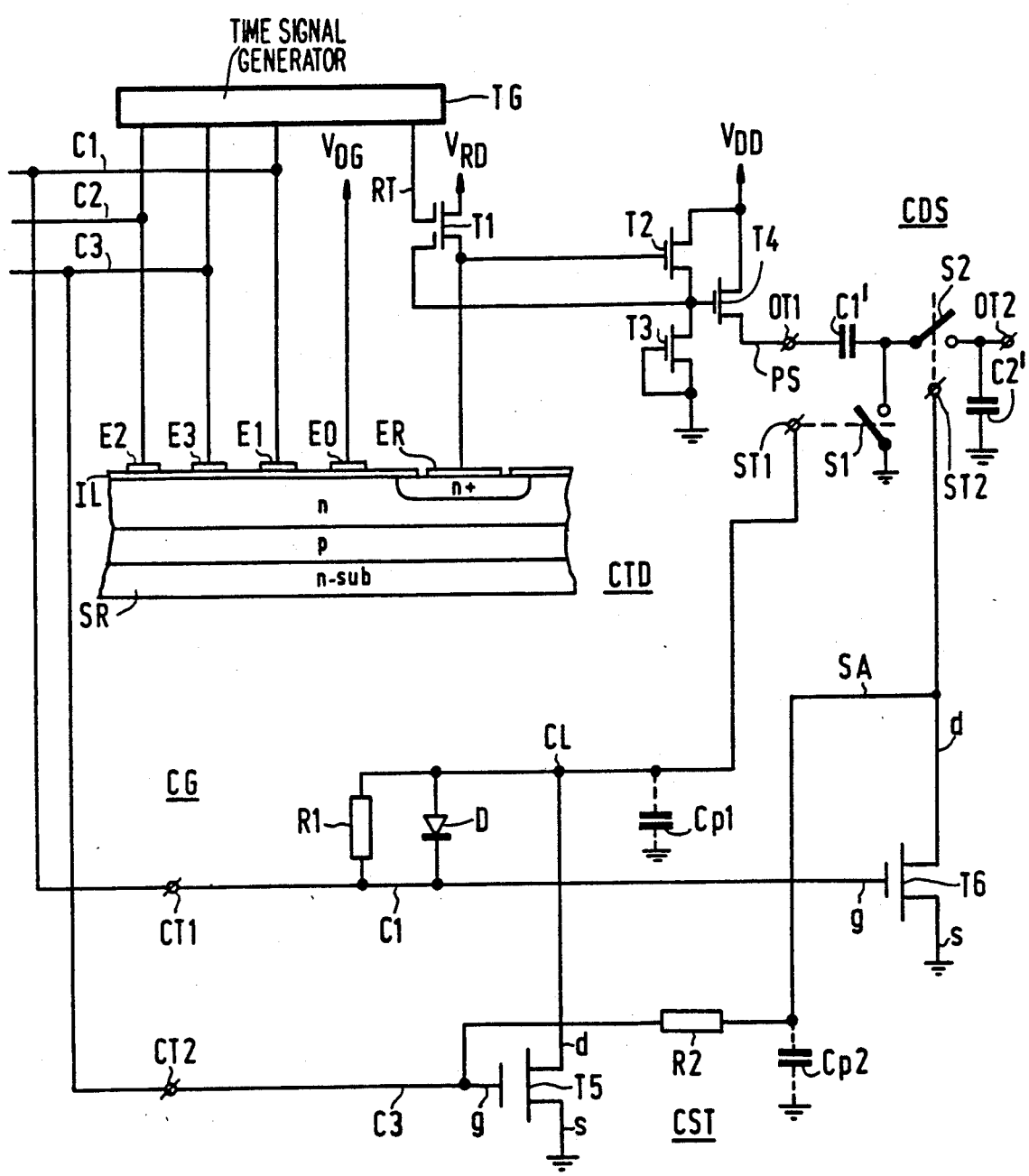
FIG. 1 is a circuit diagram of an embodiment of the sensor circuit according to the invention.

FIG. 1 shows a sensor device denoted by CTD having an output OT1 for the supply of a sensor output signal PS. A sampling circuit for correlated double signal sampling denoted by CDS is arranged between the sensor output OT1 and a sensor circuit output OT2. The sensor device CTD and the sampling circuit CDS are coupled to a clock pulse generator denoted by CG which is substantially implemented with a time signal generator TG and a clock pulse shaper CST according to the invention.

FIG. 1 shows, by way of example, a part of the sensor device CTD in the form of an integrated circuit. For details about the integrated circuit and the circuit diagram, reference is made to Philips data relating to frame transfer sensors NXA 1111, 1121, 1131 and 1141. In FIG. 1, a part of the sensor data has been taken over, namely a cross-section of a n, p, n-layer structure of a semiconductor body and some transistors T1, T2, T3 and T4 which are present in the integrated circuit. The sensor device is shown by way of example but other forms are possible in a sensor circuit according to the invention.

In FIG. 1, the reference SR denotes a cross-section through a sensor output register of the integrated circuit. The register SR is shown with an n-substrate layer (n-sub), a p-layer and an n-layer. A more highly doped $n^+$ region is present in the n-semiconductor layer on which a sensor electrode ER is provided. The Figure also shows sensor electrodes E0, E1, E2 and E3 which are present on an electrically insulating layer IL provided on the semiconductor body. The transistors T1, T2, T3 and T4 are shown as MOS transistors which are of the n-type. The transistor T1, operating as a reset transistor, is shown with a source electrode which is connected to the electrode ER, a drain electrode which receives a reset supply voltage $V_{RD}$ and two gate electrodes one of which receives a reset gate signal RT from the generator TG. The electrode ER is also connected to the gate electrode of the transistor T2. The source electrode of the transistor T2 is connected to the drain electrode of the transistor T3 and to gate electrodes of the transistors T1 and T4. In this case the reset operation is performed by means of a feedback (T2, T1). The drain electrodes of the transistors T2 and T4 are connected to a supply voltage $V_{DD}$. The gate electrode of the transistor T3 is connected to its source electrode and both are connected to ground. The source electrode of the transistor T4 is connected to the sensor output OT1. FIG. 1 shows that the electrode E0 receives a supply voltage $V_{OG}$ and E0 is operative as an output gate electrode at the integrated circuit. The supply and control voltages are considered to come from source whose terminals (not shown) are connected to ground.

The electrodes E1, E2 and E3 of FIG. 1 are connected to sensor clock pulse leads C1, C2 and C3, respectively, which convey similarly denoted multi-phase control clock pulse signals, namely three-phase signals supplied by the generator TG. The leads C1, C2 and C3 extend across and in the part (not shown) of the register SR and are connected in this register to sensor electrode E1, E2 and E3, respectively. It is assumed for the electrode sets (E1, E2, E3) that they are associated with sensor elements to be indicated similarly. The sensor element shown (E2, E3, E1) is the last in a row of transporting sensor elements in the shift register SR, an induced transistor being present under their electrodes E. In this case any sensor element can be described with an input portion under electrode E2, a central portion under electrode E3 and an output portion under electrode E1. At the transport in the shift register SR, a row of successively induced transistors thus occurs under electrode sets (E2, E3, E1), (E3, E1, E2), (E1, E2, E3), (E2, E3, E1) and so forth. For the three-phase control there are the three sensor element portions and for a four-phase control there are four sensor element portions under a series of four electrodes E. For the sake of completeness of the description, it is to be noted that the last induced transistor in the shift register SR occurs under the electrode set (E1, E0, ER), the electrode E1 being operative as a switching electrode. After a reset by the transistor T1, an information charge occurs under the electrode ER via the switching electrode E1, which charge ultimately leads to the pixel information in the sensor output signal PS.

The known sampling circuit CDS following the sensor output OT1 is shown diagrammatically with a series capacitor C1', a shunt switch S1 with a connection to ground, a series switch S2 and a capacitor C2' arranged between the sensor circuit output OT2 and ground. The control of the switches S1 and S2 is diagrammatically denoted by means of a broken line. The switches S1 and S2 are assumed to be electronic switches.

According to one aspect of the invention, the control clock pulse signals for the sampling circuit CDS are not received from the time signal generator TG but are supplied by the clock pulse shaper CST. Two inputs CT1 and CT2 of the clock pulse shaper CST are coupled to the clock pulse leads C1 and C3, respectively, conveying the similarly denoted output transport clock pulses, and two outputs ST1 and ST2 are coupled to the switches S1 and S2, respectively, of the sampling circuit CDS.

In the clock pulse shaper CST, the inputs CT2 and CT1 are coupled to control electrodes of semiconductor switching elements T5 and T6, respectively, shown in FIG. 1 as (n)MOS transistors with gate electrodes g as control electrodes. The transistors T5 and T6 are connected to ground by means of inputs indicated as source electrodes s. Drain electrodes d operating as outputs of the transistors T5 and T6 are coupled to the outputs ST1 and ST2, respectively, of the clock pulse shaper CST. The control electrode g of the transistor T6 and the input CT1 connected to it have a DC coupling to the other output ST1 via a parallel arrangement of a resistor R1 and a diode D. The output ST1 is assumed to have a parasitic capacitance Cp1 to ground. The control electrode g of the transistor T5 and the input CT2 connected to it have a DC coupling with the other output ST2 via a resistor R2. The output ST2 is assumed to have a parasitic capacitance Cp2 to ground. While receiving the output transport clock pulses C1 and C3 at the respective inputs CT1 and CT2, the clock pulse shaper CST supplies sampling clock pulses CL and SA to the respective outputs ST1 and ST2.

To illustrate the operation of the sensor circuit of FIG. 1, FIGS. 2a–2f, some time diagrams for the output transport clock pulse signals, C1, C2 and C3, the sensor output signal PS and the sampling clock pulse signals CL and SA. The clock pulses are plotted as a function of time t with a variation between the ground potential of OV and a voltage level Va. A reference voltage level denoted by Vref is shown at the known signal PS. A signal value associated with a sensor pixel is denoted by $V_{PS}$. Dependent on a black, grey or white value of the pixel, the voltage difference between Vref and $V_{PS}$ is small, larger or largest. The references t0, t1, t2, t3 and t4 denote some instants. The instants t0 and t4 are shown as a starting instant and a final instant, respectively, of a pixel period TP to be described. The signals of FIGS. 2a–2f will be described without allowing for voltage drops across the transistors T5 and T6 and the diode D of FIG. 1.

Figure 2A:
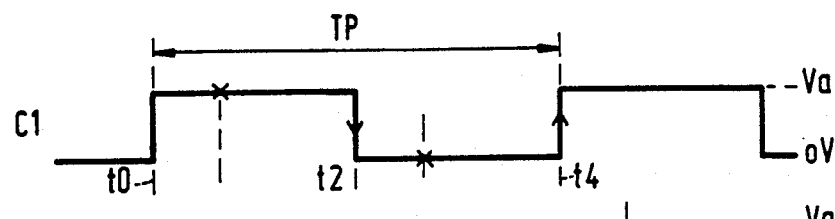
FIGS. 2a-2f shows some time diagrams to illustrate the operation of the circuit of FIG. 1.
Figure 2B:
Figure 2C:
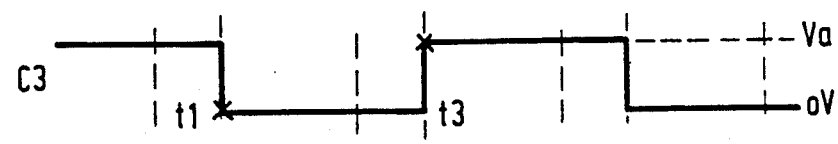
Figure 2D:
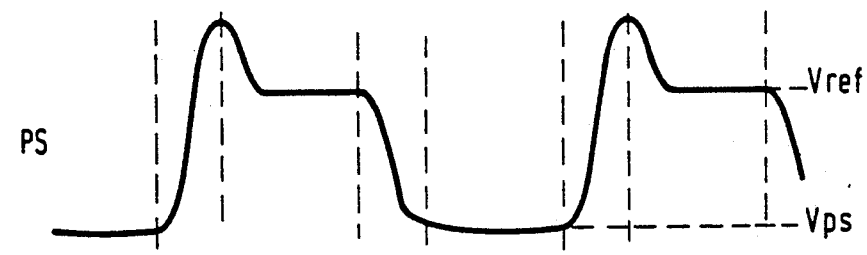
Figure 2E:
Figure 2F:

Between instants t0 and t1, it holds that C1=Va and C3=Va, in which case the transistors T6 and T5 of FIG. 1 are turned on, so that the ground potential of OV occurs in the signals CL and SA of FIGS. 2e and 2f.

At the instant t1, C3=Va changes into C3=OV. As a result, the transistor T5 is turned off and due to C1=Va a charge current will flow through the resistor R1 to the capacitance Cp1. Due to the charge supply to the capacitance Cp1 with a time constant which is equal to R1.Cp1, the leading edge of the signal CL of FIG. 2e has the variation shown. The transistor T6 which remains turned on due to C1=Va causes SA to remain OV. The operation is illustrated by means of crosses at C1 and C3.

At the instant t2, C1=Va changes into C1=OV. As a result, the capacitance Cp1 is immediately discharged across the diode D which implies a quick depletion of charge. An arrow head at the signal C1 illustrates the operation.

Between the instants t2 and t3, it holds that C1=Ov and C3=OV in which case the ground potential of Ov occurs at the outputs ST1 and ST2 conveying the respective signals CL and SA via the respective resistors R1 and R2.

At the instant t3, C3=OV changes into C3=Va. Since the transistor T6 is turned off at C1=OV, C3=Va supplies a charge current through the resistor R2 to the capacitance Cp2 so that there is a charge supply with a time constant which is equal to R2.Cp2. The signal SA of FIG. 2f shows the variation. In this case C1=OV remains valid, while CL=OV and the transistor T6 remains turned off.

At the instant t4, C1=OV changes into C1=Va. As a result, the transistor T6 is immediately turned on and the capacitance Cp2 is discharged with a quick depletion of charge. The next pixel period starts at the instant t4.

FIGS. 2e and 2f show the sampling clock pulses in the signal CL for the signal clamping and in the signal SA for the actual signal sampling, which have an effective instant just before the instants t2 and t4, respectively. This means that the state in the signal PS FIG. 2d just before the instant t2 is decisive of the signal clamping at the reference voltage level Vref and that the state just before the instant t4 is decisive of the sampling value.

These instants t2 and t4 are accurately fixed at the signals CL and SA by the signal C1 (illustrated by means of the arrow heads), the signal C3 occurring as a preparatory signal, as is comparable with flip-flop circuits having trigger and preparatory inputs. A rigid coupling is realized between the signals shown in FIGS. 2a-2f, with the instants t2 and t4 being decisive.

The clock pulse shaper CST of FIG. 1 is shown in an embodiment using the output transport clock pulse signals C1 and C3. This embodiment can be further applied if the inverted signal C2 instead of the signal C3 is utilized for shaping the sampling clock pulses according to FIGS. 2e and 2f. In this case sampling clock pulses in the signals CL and SA are generated with half a period, namely a period of 1/6 TP. The slope of the leading edges of the sampling clock pulses must be such that the sampling is not influenced by, for example, too slow switches S1 and S2 of FIG. 1. The choice of the clock pulse signals C1 and C3 is the safest for generating the clock pulses in the signals CL and SA with a period of ⅓ TP.

In the case of a four-phase clock pulse control (C1, C2, C3, C4) of the shift registers SR, the instants t2 and t4 shown in FIGS. 2a-2f determine the trailing edges of the pulses in the signals CL and SA in an unmodified form. When applying the transport clock pulse signals C1 and C4 to the clock pulse shaper CST of FIG. 1, instants t1' and t3' occur at ¼ and ¾ of the pixel period TP. The clock pulses in the signals CL and SA have a period of ¼ TP.

It is apparent from the foregoing that at least a three-phase control system must be present for the choice of two output transport clock pulse signals.

I claim:

1. A sensor circuit for correlated double signal sampling, said sensor circuit comprising a sensor device having an output for supplying a sensor output signal, a sampling circuit coupled to the output of the sensor device for performing a sampling operation, and a clock pulse generator which is coupled to a clock input of the sensor device and a sampling input of the sampling circuit for applying multi-phase control clock pulse signals thereto, characterized in that the clock pulse generator comprises at least three sensor clock pulse leads for supplying an at least three-phase control pulse to the sensor device clock input to control the sensor output signal, and a clock pulse shaper having two inputs and two outputs, the two inputs being coupled to two of the at least three sensor clock pulse leads and the two outputs being coupled to the sampling input of the sampling circuit.

2. A sensor circuit as claimed in claim 1, characterized in that each input in the clock pulse shaper is coupled to a respective control electrode of semiconductor switching elements each having an output coupled to one of the two clock pulse shaper outputs, each control electrode having a DC coupling with the other clock pulse shaper output.

3. A sensor circuit as claimed in claim 2, characterized in that a said DC coupling comprises a parallel arrangement of a resistor and a diode for supplying charge to and depleting charge from the respective clock pulse shaper outputs.

* * * * *